United States Patent
Grimshaw

(10) Patent No.: US 7,176,474 B2
(45) Date of Patent: Feb. 13, 2007

(54) METHOD AND APPARATUS FOR MEASURING AND MONITORING COATINGS

(75) Inventor: Scott Grimshaw, Marcellus, NY (US)

(73) Assignee: Tangidyne Corporation, Marcellus, NY (US)

(*) Notice: Subject to any disclaimer, the term of this patent is extended or adjusted under 35 U.S.C. 154(b) by 279 days.

(21) Appl. No.: 10/971,200

(22) Filed: Oct. 22, 2004

(65) Prior Publication Data
US 2005/0092239 A1    May 5, 2005

Related U.S. Application Data

(60) Provisional application No. 60/563,487, filed on Apr. 19, 2004, provisional application No. 60/516,149, filed on Oct. 31, 2003.

(51) Int. Cl.
*G01N 21/86* (2006.01)

(52) U.S. Cl. .............. 250/559.4; 250/239; 250/214.1

(58) Field of Classification Search ............ 250/559.4, 250/214.1, 239, 221, 231.1; 356/239.1, 239.2
See application file for complete search history.

(56) References Cited

U.S. PATENT DOCUMENTS

| | | | |
|---|---|---|---|
| 2,565,514 A | * | 8/1951 | Pajes .................. 359/276 |
| 3,655,265 A | | 4/1972 | Hammond |
| 4,311,725 A | | 1/1982 | Holland |
| 6,616,818 B2 | | 9/2003 | Gibson |
| 2006/0144154 A1 | | 7/2006 | Ueno et al. |

* cited by examiner

Primary Examiner—Que T. Le
(74) Attorney, Agent, or Firm—Burr & Brown

(57) ABSTRACT

There is provided a chip for use in a combination microbalance and optical monitor sensor, the chip comprising a piezoelectric element and electrodes formed on a first surface thereof. At least a portion of the piezoelectric element is translucent. There is also provided a chip comprising a piezoelectric element and electrodes in contact with the piezoelectric element, at least a portion of at least the first electrode being translucent, and at least a portion of the piezoelectric element being translucent. Current can be applied through the electrodes to cause a region of the piezoelectric element to undergo vibration, and light can be passed through a portion of the region of the piezoelectric element which is undergoing the vibration. There is also provided a combination microbalance and optical monitor sensor, comprising a chip as described herein, and a method of simultaneously piezoelectric crystal vibration monitoring and optically monitoring a layer.

43 Claims, 5 Drawing Sheets

METHOD AND APPARATUS FOR MEASURING AND MONITORING COATINGS

CROSS-REFERENCE TO RELATED APPLICATIONS

This application claims the benefit of U.S. Provisional Patent Applications Nos. 60/516,149, filed Oct. 31, 2003 and 60/563,487, filed Apr. 19, 2004, the entireties of which are incorporated herein by reference.

FIELD OF THE INVENTION

The present invention is directed to the measurement and process monitoring of translucent (visible, UV or Infrared) coatings, in particular, thin film coatings deposited by vacuum or atmospheric deposition techniques. The present invention is also directed to systems for such measurement and process monitoring, and to chips for use in such systems.

BACKGROUND OF THE INVENTION

Since the early 1960's, quartz crystals have been used to monitor thin film coating processes used in the fabrication of optical devices such as lenses, filters, reflectors and beam splitters. Although initially employed as an aid to optical monitors to provide information on the rate at which the film is deposited, quartz crystal sensors became relied upon to indicate and control optical layer thickness in automated deposition systems.

Research in fields such as nanotechnology, biosensors, thin film displays, and high-speed optical communications have increased the complexity of thin film structures. While an antireflection coating consisting of a single layer of magnesium fluoride may have been sufficient 20 years ago, current designs may call for a 24-layer stack of alternating refractive index films. With high-speed optical communications, this stack can be increased ten-fold or more, leading to filters comprised of up to 256 or more layers.

Quartz sensor instruments have been used to measure film thickness by monitoring a change in the frequency of vibration of a test crystal coated simultaneously with process substrates. Quartz is a well-known piezoelectric material, i.e., if a bar of quartz is bent, it will develop a voltage on opposite faces. Conversely, if a voltage is applied, the bar will bend. By applying alternating voltage to such a bar, the bar will vibrate or oscillate in phase with the voltage.

At a specific frequency of oscillation, quartz will vibrate with minimal resistance, much like a tuning fork rings when struck. This natural resonance frequency is used as the basis for measuring film thickness. By adding coatings to the crystal surface, the resonance frequency decreases linearly. If the coatings are removed, the resonance frequency increases.

In a quartz crystal thickness monitor, the quartz crystal is coupled to an electrical circuit that causes the crystal to vibrate at its natural (or resonant) frequency, which for most commercial instruments is between 5 and 6 MHz. A microprocessor-based control unit monitors and displays this frequency, or derived quantities, continuously. As material coats the crystal during deposition, the resonant frequency decreases in a predictable fashion, relative to the rate material arrives at the crystal, and the material density. The frequency change can be calculated several times per second, converted in the microprocessor to Angstroms per second and displayed as deposition rate. The accumulated coating can be displayed as total thickness.

The sensitivities of these sensors are remarkable. A uniform coating of as little as 10 Angstroms of aluminum will typically cause a frequency change of 20 Hz, easily measured by today's electronics. As the density of the film increases, the frequency shift per Angstrom increases.

Typically, quartz crystal sensors used in thin film vacuum deposition systems, coated with opaque electrodes, are placed into a metal housing, often water cooled, with one side open to the coating material source. As the coating material source turns on, material coats the open face of the crystal, as well as any substrates or objects situated nearby. This is the basis for process monitoring and control with a vibrating quartz crystal sensor, or quartz crystal microbalance (QCM) as it is often called. A significant limitation of QCM's is that they reveal no information about the optical properties of the deposited film, only the physical (thickness or mass/density).

A representative example of a conventional chip 80 for use in a thin film monitor is depicted in FIGS. 8–10. FIG. 8 is a top view showing a first gold electrode 81 and a piezoelectric element 83. FIG. 9 is a bottom view showing a second gold electrode 82. FIG. 10 is a sectional view taken along line 10—10 in FIG. 8. The region in which the most pronounced vibration will occur (upon passing a current between the first and second electrodes 81 and 82) is in the center of the chip.

In the process of manufacturing elements, e.g., optical elements, such as lenses, glass filters, and telecommunication components, a second thin film coating measurement technique, known as Optical Monitoring (OM) has also been employed. In this set-up, a glass disc, or monitoring chip, is placed near the objects to be coated. A beam of light is introduced into the process chamber, either by a lamp or laser shining through a window into the chamber from the outside, or a suitable light source inside the chamber. On the other side of the chip (in or out of the chamber), there is positioned a light detection device, such as a photocell or photo multiplier tube. As the coating covers the monitor chip, the growing film or coating manifests the optical properties of interference, reflection or absorption. This changes the amount of light reaching the detection device. During the coating process, these changes are continually monitored and can be used to control the coating process. A limitation of optical monitoring is that it is practically impossible to detect small (10 Angstrom) level thickness changes, especially in real-time fashion to the extent that the coating source can be accurately controlled. This is critical, since many optical films are dependent on the rate of the coating in order to insure proper refractive index, density, stress and other film properties.

U.S. Pat. No. 4,311,725 discloses an apparatus for sensing and controlling the deposition of a thin film on to a substrate 12 from a gas or vapor phase, in which the optical reflectance or transmittance is sensed, and in which the resonant frequency of a crystal 14 also exposed to the deposition is sensed. The patent discloses a method of sensing and controlling the deposition of a thin film onto a substrate from a gas or vapor phase, the method comprising: sensing the optical reflectance or optical transmittance or electrical resistivity of the deposited film and providing a first signal having a value representative of the value of the sensed property; arranging an oscillatable crystal adjacent to the substrate with at least one surface of the crystal exposed to the gas or vapor phase; determining by timing and calculating means the absolute resonance frequency of the oscillatable crystal and deriving a second signal having a value representative of the resonance frequency; determining over a first predetermined interval of time the quotient of the change in the first signal and the change in the second signal; providing an output signal dependent on the quotient; and controlling the variable of the deposition process in accordance with the output signal.

U.S. Pat. No. 6,616,818 discloses an apparatus and method for coating substrates. According to the patent, it is preferred that the apparatus include a detection means adapted to detect certain conditions within the chamber, and that the detection means include a vapor detection means adapted to detect vaporized source material within the chamber. According to the patent, preferably the vapor detection means comprises at least one detector capable of detecting the vapor. The patent discloses that it is preferable to use more than one detector, and that in practice, at least three vapor detectors are preferred, and, ideally, there should be a minimum of six detectors. According to the patent, the detectors are most preferably distributed quartz crystals, and the crystals change the frequency of oscillation as the amount of vaporized material builds up, and hence provide a measure of the amount of vaporized material.

U.S. Pat. No. 6,616,818 states that it is preferred that the detection means additionally, or instead, comprise an optical monitoring detection means adapted to detect the level of deposition of the source material on the substrate, the substrate detection means including at least one detector capable of detecting the change in light level due to optical interference from the film surfaces as the thickness of the deposit on the substrate changes. In practice, the patent discloses, a monochromatic beam at the desired design wavelength $\lambda_0$, is obtained in the monitoring system by incorporating a monochromator, and a measure of the transmittance of the deposited coating is obtained in terms of the detector output. Specific transmittance is a function of the film thickness. The patent states that it is preferable to use more than one detector, spatially distributed, as this, according to the patent, provides a measure of the level of deposition over the whole of the substrate. In practice, the patent states, at least three substrate detectors are preferred at center, middle and edge substrate positions. The substrate detection means may comprise a light source and a light detector each arranged on opposite sides of the substrate.

U.S. Pat. No. 6,616,818 discloses an apparatus 10 as depicted in FIG. 1. The apparatus 10 comprises a vacuum chamber 12, a rotatable substrate carrier 14 positioned within the vacuum chamber 12 which carries one or more substrates 16 to be coated (or cleaned). A rotary drive mechanism 18 is provided to rotate the substrate carrier 14. Also within the vacuum chamber there is disposed a vaporization means generally designated 20. The apparatus 10 further includes a detection means in the form of a plurality of distributed quartz crystals 56 which are disposed around the chamber 12. The detection means of the apparatus 10 further includes an optical detection means in the form of laser light source 62 and a light detector 64. The light source is provided is connected to three fiber optic cables 66, which deliver three light beams to the chamber 12. Three optical monitor witness pieces 68 are provided on the substrate carrier 14 to enable the light to pass through the substrate carrier 14. The base of the chamber 12 is provided with three fiber optic cables 70, each of which is aligned with a respective one of the fiber optic cables 66, to carry the light to the detector 64.

A paradigm shift is underway in quartz crystal process monitoring. In many applications, crystals become the keys to success. No matter how significant a breakthrough may be in optics, be it materials, geometry, process design or application, if a coating of any sophistication is required, the weak link is how accurately that coating can be measured. As technology closes in on manipulating Angstrom-level properties of matter, the need for reliable thin film metrology rises to a new level of importance. There is, accordingly, an ongoing need for improvements in measurement and process monitoring of translucent coatings, e.g., coatings deposited by vacuum or atmospheric deposition techniques. The expression "translucent," as used herein, means that at least some portion of light directed toward a first side of the structure passes into and exits the structure.

BRIEF SUMMARY OF THE INVENTION

In accordance with the present invention, the accuracy of measurement and process monitoring of translucent coatings, e.g., thin film coatings deposited by vacuum or atmospheric deposition techniques is improved by performing both piezoelectric crystal vibration monitoring (e.g., piezoelectric crystal vibration monitoring) and optical monitoring at the same location or near the same location. The present invention also provides systems and methods which make it possible to perform both piezoelectric crystal vibration monitoring and optical monitoring at the same location (or near the same location) on a film as it is being deposited. The expression "near the same location," as used herein, means that the respective locations are spaced from each other by at most 10% of the longest dimension of the surface on which they are located (e.g., on a circular surface having a diameter of 1 cm, the respective locations are spaced from each other by not more than 0.1 cm).

That is, the present inventor has recognized that correlation errors are introduced between conventional systems which include both QCM and OM devices since their respective sensors are placed in different positions in relation to the parts being coated, and that these correlation errors can dramatically affect process repeatability and success. The present invention provides systems and methods which overcome these limitations of prior art systems.

Referring to the chip depicted in FIGS. 8–10, light cannot be passed through the center region of the chip, where vibration occurs, because the gold electrodes 81 and 82 are opaque.

In accordance with a first aspect of the present invention, there is provided a chip for use in a combination microbalance and optical monitor sensor, the chip comprising a piezoelectric element and first and second electrodes spaced from each other and both formed on one surface of the piezoelectric element, whereby current can be applied through the electrodes to cause at least a region of the piezoelectric element to undergo vibration, at least a portion of the piezoelectric element being translucent such that at least a portion of a beam of light directed toward the chip can be passed from outside of the chip, passed through a portion of the region of the piezoelectric element which is undergoing the vibration, and passed out of the chip. In this first aspect of the present invention, the electrodes are positioned off to the sides of the crystal while still being able to cause the crystal to vibrate, e.g., by using parallel field excitation (where the crystal electrodes are placed on the same side of the crystal and are separated by a distance), surface wave (SW), flexural plate wave (FPM) or any of a number of other piezoelectric element-vibrating electrode arrangements that can be constructed while leaving a clear center region in the crystal.

In one preferred aspect, the piezoelectric element in the chip of the first aspect of the present invention has a second surface such that at least a portion of a beam of light directed toward the first surface can be passed from outside of the chip, passed through the first surface (on which electrodes are positioned), through a portion of the region of the piezoelectric element which is undergoing the vibration, and passed through the second surface.

In another preferred aspect, the piezoelectric element in the chip of the first aspect of the present invention has a second surface such that at least a portion of a beam of light directed toward the second surface can be passed from outside of the chip, passed through the second surface, passed through a portion of the region of the piezoelectric element which is undergoing the vibration, and passed through the first surface (on which electrodes are positioned).

In another preferred aspect, the piezoelectric element in the chip of the first aspect of the present invention reflects at least a portion of light, whereby at least a portion of a beam of light directed toward a first surface (on which electrodes are positioned) of the chip can be passed from outside of the chip, passed through the first surface, passed into a portion of the region of the piezoelectric element which is undergoing the vibration, and passed back through the first surface. Alternatively, the first surface of the piezoelectric element (on which electrodes are positioned) is reflective, whereby at least a portion of a beam of light directed toward a first surface of the piezoelectric element can be passed from outside of the piezoelectric element and reflected by the reflective surface of the piezoelectric element.

In another preferred aspect, the piezoelectric element in the chip of the first aspect of the present invention reflects at least a portion of light, whereby at least a portion of a beam of light directed toward the second surface can be passed from outside of the chip, passed through the second surface, passed into a portion of the region of the piezoelectric element which is undergoing the vibration, and passed back through the second surface. Alternatively, the second surface of the piezoelectric element is reflective, whereby at least a portion of a beam of light directed toward a second surface of the piezoelectric element can be passed from outside of the piezoelectric element and reflected by the reflective surface of the piezoelectric element.

In another preferred aspect, the chip of the first aspect of the present invention further comprises a reflective element on the first surface (on which electrodes are positioned), whereby at least a portion of a beam of light directed toward a second surface of the piezoelectric element can be passed from outside of the chip, passed through the second surface, passed through a portion of the region of the piezoelectric element which is undergoing the vibration to the first surface, reflected by the reflective element, passed back through a portion of the region of the piezoelectric element which is undergoing the vibration, and passed back through the second surface and out of the chip.

In another preferred aspect, the piezoelectric element in the chip of the first aspect of the present invention has a second surface and the chip further comprises a reflective element on the second surface, whereby at least a portion of a beam of light directed toward the first surface (on which electrodes are positioned) can be passed from outside of the chip, passed through the first surface, passed through a portion of the region of the piezoelectric element which is undergoing the vibration to the second surface, reflected by the reflective element, passed back through a portion of the region of the piezoelectric element which is undergoing the vibration, and passed through the first surface back out of the chip.

In another preferred aspect, the piezoelectric element in the chip of the first aspect of the present invention has a second surface opposite to the first surface, the first surface being substantially convex. Preferably, in this preferred aspect, the second surface is substantially flat or substantially convex.

In accordance with a second aspect of the present invention, there is provided a chip for use in a combination microbalance and optical monitor sensor, the chip comprising a piezoelectric element and first and second electrodes in contact with the piezoelectric element and being spaced from each other, whereby current can be applied through the electrodes to cause at least a region of the piezoelectric element to undergo vibration, at least a portion of the first electrode being translucent, and at least a portion of the piezoelectric element being translucent such that at least a portion of a beam of light directed toward the chip can be passed from outside of the chip, passed through the first electrode, passed through a portion of the region of the piezoelectric element which is undergoing the vibration, and passed out of the chip. In this second aspect of the present invention, at least a portion of one or both of the piezoelectric element-vibrating electrodes is constructed using a translucent but electrically conductive coating.

In one preferred aspect, the piezoelectric element in the chip of the second aspect of the present invention reflects a portion of light, whereby a portion of a beam of light directed toward a first surface of the piezoelectric element can be passed from outside of the chip, passed through the first electrode, passed through the first surface of the piezoelectric element, passed through a portion of the region of the piezoelectric element which is undergoing the vibration, and passed back through the first surface of the piezoelectric element. Alternatively, a surface of the piezoelectric element is reflective, whereby at least a portion of a beam of light directed toward the first surface of the piezoelectric element can be passed from outside of the piezoelectric element, passed through the first electrode, passed through the first surface of the piezoelectric element, reflected by the reflective surface of the piezoelectric element, and passed back through the first surface of the piezoelectric element.

In another preferred aspect, the piezoelectric element in the chip of the second aspect of the present invention has a first surface and a second surface, at least a portion of the first electrode being positioned on the first surface, at least a portion of the second electrode being positioned on the second surface.

In another preferred aspect, the piezoelectric element in the chip of the second aspect of the present invention has a first surface and a second surface, the chip further comprising a reflective element on the second surface, whereby at least a portion of a beam of light directed toward the first surface can be passed from outside of the chip, passed through the first electrode, passed through the first surface, passed through a portion of the region of the piezoelectric element which is undergoing the vibration to the second surface, reflected by the reflective element, passed back through a portion of the region of the piezoelectric element which is undergoing the vibration, and passed back through the first surface. Preferably, the reflective element is the second electrode and/or the first surface is substantially convex, and/or the second surface is substantially flat or convex. The respective entireties of the first and second electrodes can be positioned on different (e.g., opposite)

surfaces of the piezoelectric element, or portions of either or both electrodes can be positioned on one or more surfaces of the piezoelectric element.

In another preferred aspect, an entirety of the first electrode of the chip of the second aspect of the present invention is translucent.

In another preferred aspect, an entirety of the second electrode of the chip of the second aspect of the present invention is translucent, such that at least a portion of a beam of light directed toward the chip can be passed from outside of the chip, passed through the first electrode, passed through a portion of the region of the piezoelectric element which is undergoing the vibration, passed through the second electrode and passed out of the chip.

In another preferred aspect, at least a portion of at least one of the electrodes in the chip of the first or second aspect of the present invention is reflective such that at least a portion of a beam of light directed toward a first surface of the piezoelectric element can be passed through a film being deposited on the chip, reflected by the at least a portion of at least one of the electrodes, and passed back through the film being deposited.

In accordance with a third aspect of the present invention, there is provided a combination microbalance and optical monitor sensor, comprising any of the chips as described above; at least one light source which directs a beam of light toward the chip; at least one light intensity detector having a detection area which outputs a signal which has a magnitude which is proportional to an intensity of light exiting from the chip and incident upon the detection area; a power supply for applying a voltage between the first electrode of the chip and the second electrode of the chip; and a resonant frequency detector for detecting a resonant frequency of vibration of the chip.

In accordance with a fourth aspect of the present invention, there is provided a method of simultaneously piezoelectric crystal vibration monitoring and optically monitoring a layer, comprising:

applying a voltage across a piezoelectric element from a first electrode to a second electrode, the first electrode and the second electrode being in contact with the piezoelectric element, the first electrode being spaced from the second electrode, thereby causing at least a region of the piezoelectric element to undergo vibration, the piezoelectric element being in contact with a layer which is being piezoelectric crystal vibration monitored and optically monitored, the piezoelectric element, the first and second electrodes and the layer together constituting an assembly;

detecting a resonant frequency of the region of the piezoelectric element which is undergoing vibration;

directing light toward the assembly such that at least a portion of the light enters the region of the piezoelectric element which is undergoing vibration; and detecting an intensity of at least one beam of light which is exiting from the assembly.

In one preferred aspect of this method, at least a portion of the light passes through the layer, through a portion of the region of the piezoelectric element which is undergoing the vibration, and out of the assembly. Preferably, at least a portion of the first electrode is translucent, and the portion of light also passes through the translucent portion of the first electrode. In addition, at least a portion of the second electrode may be translucent, and the portion of light may also passes through the translucent portion of the second electrode.

In another preferred aspect of the method according to the fourth aspect of this invention, the piezoelectric element has a first surface and a second surface, and at least a portion of the light passes through the layer, through the first surface, through a portion of the region of the piezoelectric element which is undergoing the vibration, and through the second surface.

In another preferred aspect of the method according to the fourth aspect of this invention, at least a portion of the light passes from outside of the assembly through the layer, passes through a first surface of the piezoelectric element into a portion of the region of the piezoelectric element which is undergoing the vibration, is reflected within the piezoelectric element, passes back through the first surface and passes back through the layer.

In another preferred aspect of the method according to the fourth aspect of this invention, the assembly further comprises a reflective element on a first surface of the piezoelectric element, and at least a portion of the light passes from outside of the assembly through a second surface of the piezoelectric element, passes through a portion of the region of the piezoelectric element which is undergoing the vibration to the first surface, is reflected by the reflective element, passes back through a portion of the region of the piezoelectric element which is undergoing the vibration, and passes back through the second surface and out of the chip.

In accordance with the present invention, by combining the two measurement techniques in a single device and performing both piezoelectric crystal vibration monitoring and optical monitoring at the same location or near the same location, several advantages become apparent: 1) there is no need to set up and purchase two different types of instrumentation in order to accurately monitor coating processes, 2) errors in correlating the two different measurement techniques, due to different geometrical placement of the two devices, are eliminated since one device does both functions, 3) the simultaneous measurement of two critical coating process variables, being namely the rate of coating per unit time (as measured by piezoelectric crystal vibration monitoring) and the optical interference or absorption properties (as measured by optical chip monitoring), will reveal new information regarding real-time process interactions, such as the effect of coating rate on the optical characteristics (refractive index, optical density, etc.), and 4) the device would in essence be its own backup in the event of failure of the sensor in one measurement technique (i.e., if the crystal in a piezoelectric crystal vibration monitor stopped vibrating, the optical measurement technique is still enabled, and vice versa).

The devices and methods according to the present invention can be used to provide measurement and process monitoring of translucent (visible, UV or Infrared) coatings in real time, i.e., as the coatings are being deposited, if desired.

The devices according to the present invention can be used to automatically control deposition sources, ensure repeatable and accurate coatings, and control properties dependent on deposition rate. The present invention provides improved accuracy in these measurements.

As used herein, the term "substantially," e.g., in the expressions "substantially flat", "substantially convex", "substantially plano-convex" and "substantially parallel", etc., means about 95% correspondence with the feature recited, e.g., "substantially flat" means that a plane encompassing any trio of points in the structure and a plane encompassing any other trio of points in the structure define an angle not greater than 5% of 90 degrees, i.e., 4.5 degrees; "substantially parallel" means that two lines (or two planes)

diverge from each other at most by an angle of 5% of 90 degrees, i.e., 4.5 degrees; etc.

As used herein, the term "surface," unless otherwise described, can be substantially flat, substantially convex, substantially concave, or any other regular or irregular shape.

The invention may be more fully understood with reference to the accompanying drawings and the following detailed description of the invention.

BRIEF DESCRIPTION OF THE DRAWING FIGURES

DETAILED DESCRIPTION OF THE INVENTION

Figure 1:
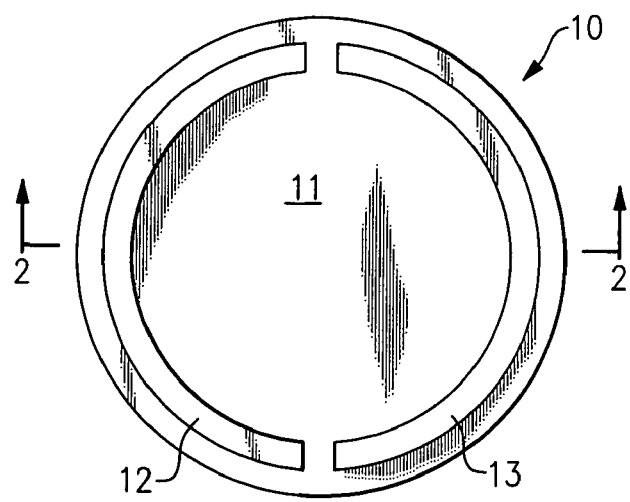
FIG. 1 is a top view of a first embodiment of a chip in accordance with the present invention.

As noted above, a first aspect of the present invention is directed to a chip for use in a combination microbalance and optical monitor sensor, the chip comprising a piezoelectric element having a first surface; and first and second electrodes formed on the first surface and being spaced from each other, whereby current can be applied through the electrodes to cause at least a region of the piezoelectric element to undergo vibration, at least a portion of the piezoelectric element being translucent such that at least a portion of a beam of light directed toward the chip can be passed from outside of the chip, passed through a portion of the region of the piezoelectric element which is undergoing the vibration, and passed out of the chip.

The expression "chip," as used herein, should be understood to be not limited to any particular shape; rather, a chip as described herein can be of any suitable shape, so long as the functions described herein are indeed provided by the device in which such chip is included.

The piezoelectric element employed in the chip according to the first aspect of the present invention can generally be made of any piezoelectric material which is translucent to visible light, ultraviolet light and/or infrared light, a number of which are well-known to those skilled in the art. For example, preferred piezoelectric elements include elements made of quartz (polished) or gallium phosphate. In cases where the piezoelectric material is quartz crystal, the crystal is preferably a singly rotated cut (e.g., an AT-cut crystal) or a doubly rotated cut (e.g., an IT-cut crystal or an SC-cut crystal), such crystal cuts being well-known to those of skill in the art.

The piezoelectric element employed in the chip according to the first aspect of the present invention can generally be of any suitable shape, so long as it can be caused to vibrate by applying electric current between electrodes formed on a surface thereof. Preferably, the piezoelectric element is substantially plano-convex or has opposite surfaces which are substantially flat and parallel. A preferred shape is substantially cylindrical with the axial dimension being much smaller than the radial dimension. Preferably, the edges of the piezoelectric element are beveled, as is well-known in the art.

The electrodes employed in the chip according to the first aspect of the present invention can be of any shape and made of any material such that they can be applied to a surface of the piezoelectric element and can be used to apply current to the piezoelectric element so as to cause the piezoelectric element to vibrate. A variety of electrode shapes and materials are suitable for this purpose, and such materials, e.g., gold, copper and other metals, are well-known to those skilled in the art. For example, in a preferred aspect of the present invention, parallel field excitation is a well-known technique for causing a piezoelectric element to vibrate, and persons of skill in the art are familiar with a wide variety of structures (piezoelectric elements and electrodes) which can be used to construct chips which will exhibit parallel field excitation of the piezoelectric element when appropriate current is applied to the electrodes. Similarly, persons of skill in the art are familiar with surface acoustic wave (SAW) arrangements, flexural plate wave (FPM) arrangements, and a number of other piezoelectric element-vibrating electrode arrangements that can be constructed while not covering a center region in the crystal, and all such arrangements are within the scope of the present invention.

As noted above, the chip according to the first aspect of the present invention can further comprise a reflective element on the first surface or the second surface. Persons of skill in the optics art are familiar with a wide variety of materials and structures formed of such materials which can be used to provide suitable reflective elements, and any such structures are within the scope of the present invention.

As noted above, a second aspect of the present invention is directed to a chip for use in a combination microbalance and optical monitor sensor, the chip comprising a piezoelectric element; and first and second electrodes in contact with the piezoelectric element and being spaced from each other, whereby current can be applied through the electrodes to cause at least a region of the piezoelectric element to undergo vibration, at least a portion of at least the first electrode being translucent, and at least a portion of the piezoelectric element being translucent such that at least a portion of a beam of light directed toward the chip can be passed from outside of the chip, passed through the first electrode, passed through a portion of the region of the piezoelectric element which is undergoing the vibration, and passed out of the chip.

The piezoelectric element employed in the chip according to the second aspect of the present invention can generally be made of any piezoelectric material which falls within the description above regarding the first aspect of the present invention. The piezoelectric element employed in the chip according to the second aspect of the present invention can generally be of any suitable shape, so long as it can be caused to vibrate by applying electric current between electrodes formed thereon. Preferably, the piezoelectric element is substantially plano-convex or has opposite surfaces which are substantially flat and parallel. A preferred shape is substantially cylindrical with the axial dimension being much smaller than the radial dimension. Preferably, the edges of the piezoelectric element are beveled, as is well-known in the art.

The electrodes employed in the chip according to the second aspect of the present invention can be of any shape and made of any material such that they can be applied to a surface of the piezoelectric element and can be used to apply current to the piezoelectric element so as to cause the piezoelectric element to vibrate. As noted above, at least a portion of at least the first electrode is translucent. A variety of electrode shapes and materials are suitable for this purpose, and such materials, e.g., gold, copper and other metals, are well-known to those skilled in the art. For example, indium tin oxide and tungsten trioxide are two materials which are well-known as being suitable for use in making translucent electrodes.

As noted above, the chip according to the second aspect of the present invention can further comprise a reflective element on a surface of the piezoelectric element. Persons of skill in the optics art are familiar with a wide variety of materials and structures formed of such materials which can be used to provide suitable reflective elements, and any such structures are within the scope of the present invention.

As noted above, a third aspect of the present invention is directed to a combination microbalance and optical monitor sensor, comprising a chip according to the first aspect or the second aspect of the present invention as described above; at least one light source which directs a beam of light toward the chip; at least one light intensity detector having a detection area which outputs a signal which has a magnitude which is proportional to the intensity of light exiting from the chip and incident upon the detection area; a power supply for applying a voltage between the first electrode of the chip and the second electrode of the chip; and a resonant frequency detector for detecting a resonant frequency of vibration of the chip.

Those skilled in the optical monitoring art are familiar with a wide variety of suitable light sources (reflectance and transmittance sources) for use with specific materials included in the chip being monitored, and a wide variety of suitable light intensity detectors for use with particular light sources and chips. Any such light sources and light intensity detectors can be employed in the combination microbalance and optical monitor sensors in accordance with this aspect of the present invention.

Those skilled in the thin film monitoring art are familiar with providing a suitable power supply for applying a voltage between the first and second electrodes of chips including piezoelectric elements as described above in connection with the first and second aspects of the present invention. In addition, persons skilled in the thin film monitoring art are familiar with resonant frequency detectors which can detect a resonant frequency of vibration of chips which include piezoelectric elements as described above. Any of such power supplies and any of such resonant frequency detectors can be employed in the sensor according to the present invention.

In an example of a system which employs a sensor according to the present invention, a chip is contained in a housing, mounted in a line-of-sight position relative to a coating source (electron beam, thermal evaporation, sputtering, etc.). Substrates to be coated are positioned close to the chip, ensuring that the amount of material (e.g., evaporant) depositing on the substrates and chip are substantially identical. If this is not the case, a geometrical correction or "tooling factor," is applied. A light source and a light detector are positioned relative to the chip such that at least a portion of the light from the source passes through the chip or is reflected by the chip and is then detected by the light intensity detector.

As noted above, a fourth aspect of the present invention is directed to a method of simultaneously piezoelectric crystal vibration monitoring and optically monitoring a layer, comprising:

applying a voltage across a piezoelectric element from a first electrode to a second electrode, the first electrode and the second electrode being in contact with the piezoelectric element, the first electrode being spaced from the second electrode, thereby causing at least a region of the piezoelectric element to undergo vibration, the piezoelectric element being in contact with a layer which is being piezoelectric crystal vibration monitored and optically monitored, the piezoelectric element, the first and second electrodes and the layer together constituting an assembly;

detecting a resonant frequency of the region of the piezoelectric element which is undergoing vibration;

directing light toward the assembly such that at least a portion of the light enters the region of the piezoelectric element which is undergoing vibration; and detecting an intensity of at least one beam of light which is exiting from the assembly.

The piezoelectric element and electrodes employed in connection with the fourth aspect of the present invention can be any of those described above in connection with the first, second and third aspects of the present invention.

The detection of resonant frequency according to the fourth aspect of the present invention can be carried out in any suitable way, including those well-known to those of skill in the thin film monitoring art. In carrying out the detection of resonant frequency, the frequency of vibration of the piezoelectric element is sensed using any suitable device. For example, skilled artisans are familiar with microprocessors which can be readily set up to read frequency of vibration of the piezoelectric element. Similarly, any of a variety of well-known devices are known to be suitable for converting frequency of vibration data to deposition rate (e.g., Angstroms per second) and/or to accumulated coating values (i.e., total thickness, e.g., in Angstroms), and any such devices can be used in accordance with the fourth aspect of the present invention. For example, skilled artisans are familiar with setting up microprocessors to perform such conversions. A variety of algorithms for performing such calculations are well-known to those of skill in the art (see, e.g., Chih-shun Lu, "Mass determination with piezoelectric quartz crystal resonators," *J. Vac. Sci. Technol.*, Vol. 12, No. 1, (January/February 1975), the entirety of which is hereby incorporated by reference). Corrections can be made to the thickness calculation algorithm to account for acoustic impedance, as is well-known in the art. In addition, well-known electronics and shielding are preferably employed in order to eliminate radio frequency interference and voltage variations.

Directing light toward the assembly such that at least a portion of the light enters the region of the piezoelectric element which is undergoing vibration and detecting an intensity of at least one beam of light which is exiting from the assembly can be carried out in any of a variety of ways which are well-known to those skilled in the optical monitoring art. As a material is being deposited, light is transmitted through, reflected by, or absorbed into, the material being deposited. The light source can be any of multiple types depending of the type of coating being deposited. Alternatively or additionally, light from the source can be affected, e.g., by positioning a monochromator somewhere between the source and the detector. Monochromatic and bichromatic, light sources (light of one specific wavelength and light of two specific wavelengths, respectively) are most often used for monitoring the thickness and deposition rate while fabricating coatings that require the deposition to terminate at a reflectance maxima or minima at ¼ λ multiples, such as narrow band Wavelength Division Multiplex (WDM) filters, for example. In the bichromatic method, the difference in the measurement of the two light wavelengths are calculated after they have been reflected by, or transmitted through the material. Utilizing a monochromatic light source, the maxima and minima of the raw change in reflectance or transmission of the light, which occur at alternating quarter wavelength intervals, can be measured to produce a proportional measurement of the coating thickness. Broadband light sources are often used in the manufacture of components that are required to present a spectrum of wavelengths. As with the bichromatic method, differences in the measurement of the light wavelengths are calculated after they have been reflected by, or transmitted through the material. In the use of multichromatic light sources (light of multiple specific wavelengths) the wavelengths are often chosen such that for each layer of material, the reflected, or transmitted light of each wavelength represents an extremum. Multichromatic light sources are often used in the manufacture of antireflection filters.

Figure 2:
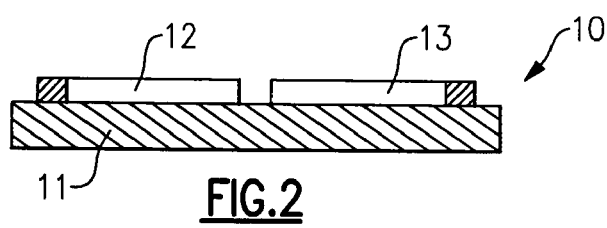
FIG. 2 is a sectional view along line 2—2 of the chip depicted in FIG. 1.

An embodiment of a chip in accordance with the first aspect of the present invention is depicted in FIGS. 1 and 2 (FIG. 2 is a sectional view along line 2—2 of FIG. 1). The chip 10 includes a piezoelectric element 11, a first electrode 12 and a second electrode 13.

Figure 3:
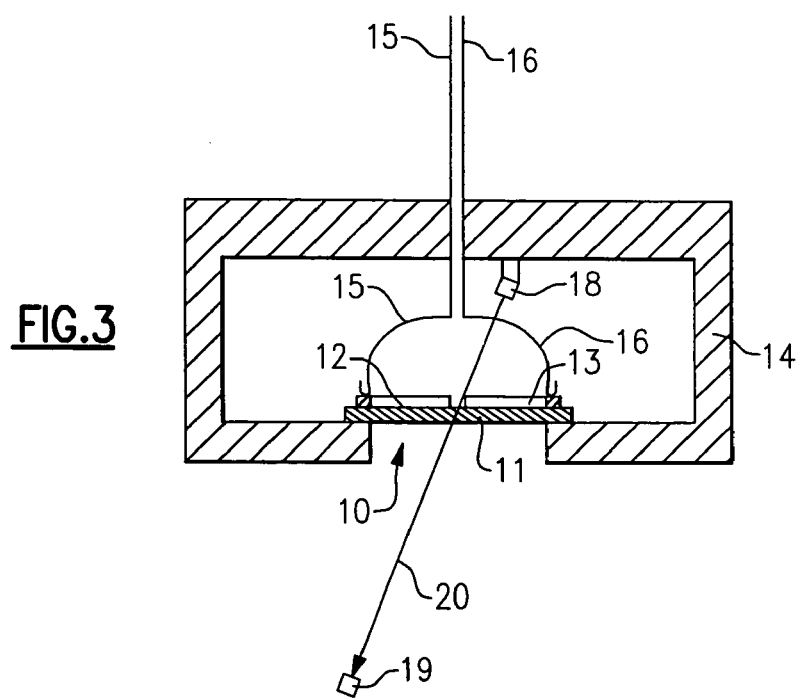
FIG. 3 is a schematic illustration of a first embodiment of a combination microbalance and optical monitor sensor in accordance with the present invention.

FIG. 3 schematically depicts a combination microbalance and optical monitor sensor in accordance with the third aspect of the present invention, including a chip 10 corresponding to the embodiment shown in FIGS. 1 and 2 as described above. In the embodiment shown in FIG. 3, the chip 10 is mounted on a body 14 made of a block with a center portion thereof milled out. The body 14 is non-conductive and/or includes suitable insulators to prevent electrical conductivity between the first electrode 12 and the second electrode 13 through the body 14. A pair of spring contact electrodes 15 and 16 are in contact with the first and second electrodes 12 and 13, respectively, and do not electrically contact one another. Voltage is applied between the first electrode and the second electrode by a power supply (not shown). The spring contact electrodes 15 and 16 minimize extraneous vibrations. FIG. 3 further depicts a light source 18 which directs a beam of light 20 through the chip 10 toward a detector 19. The positions of the light source 18 and the detector 19 can be switched, i.e., the light source 18 can instead be outside the body 14 and the detector 19 can be inside the body 14, if desired.

Figure 4:
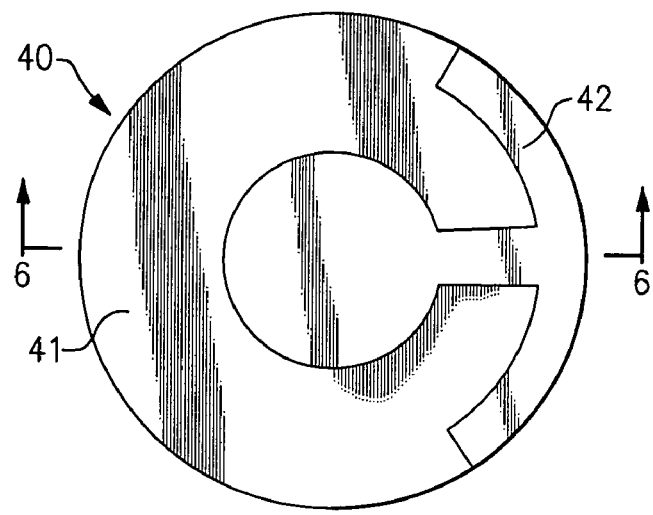
FIG. 4 is a top view of a second embodiment of a chip in accordance with the present invention.
Figure 5:
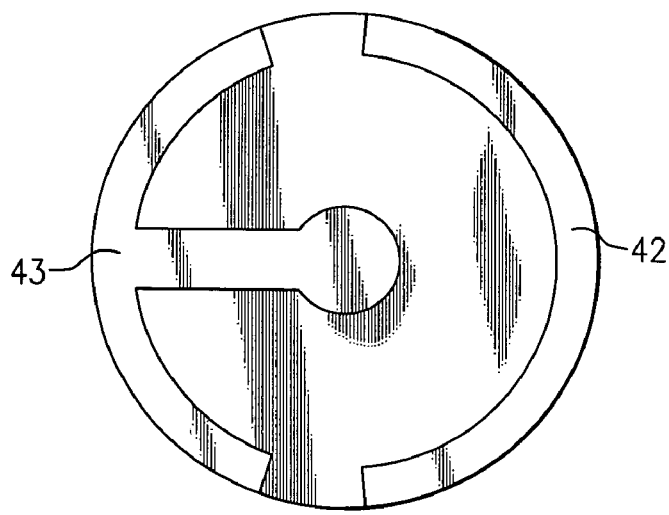
FIG. 5 is a bottom view of the chip depicted in FIG. 4.
Figure 6:
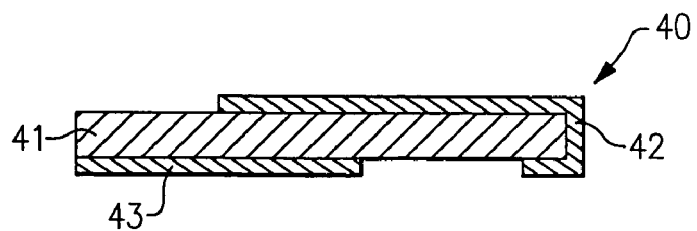
FIG. 6 is a sectional view along line 6—6 of the chip depicted in FIG. 4.

An embodiment of a chip in accordance with the second aspect of the present invention is depicted in FIGS. 4–6, in which FIG. 4 is a top view of a chip 40, FIG. 5 is a bottom view of the chip 40, and FIG. 6 is a sectional view along line 6—6 of FIG. 4. The chip 40 includes a piezoelectric element 41, a first electrode 42 and a second electrode 43. As shown most clearly in FIG. 6, the first electrode 42 wraps around from the top surface of the piezoelectric element 41 to the bottom surface of the piezoelectric element 41.

Figure 7:
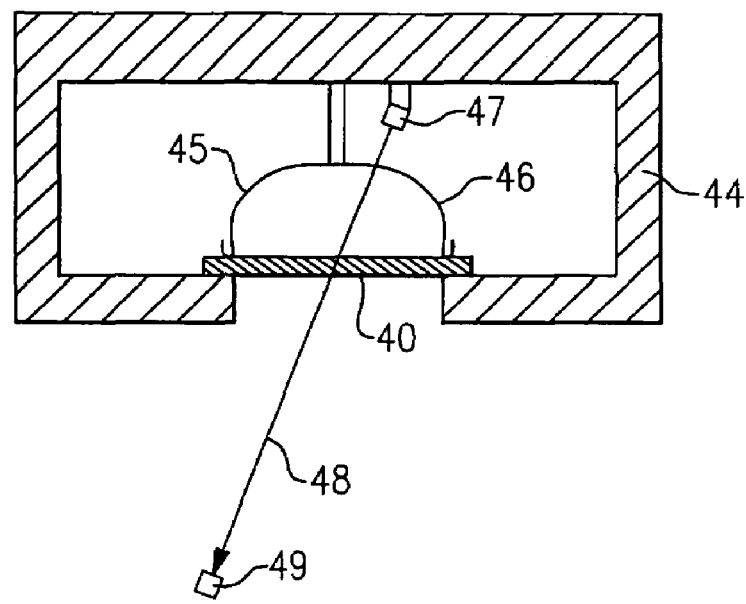
FIG. 7 is a schematic illustration of a second embodiment of a combination microbalance and optical monitor sensor in accordance with the present invention.
Figure 8:
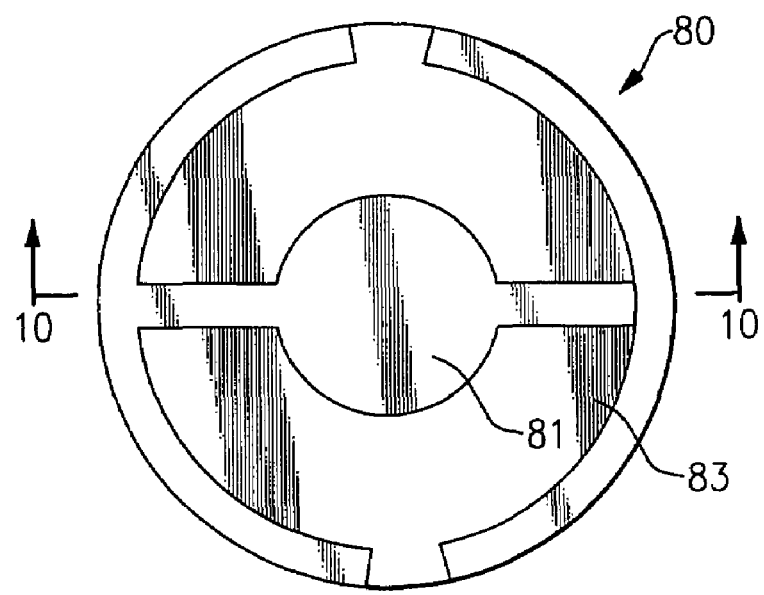
FIG. 8 is a top view of a conventional chip for use in a conventional microbalance.
Figure 9:
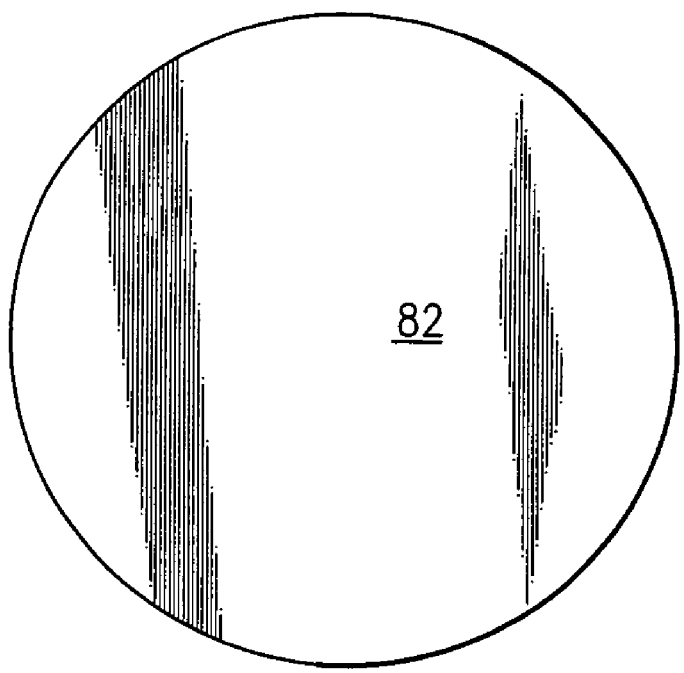
FIG. 9 is a bottom view of the chip depicted in FIG. 9.
Figure 10:
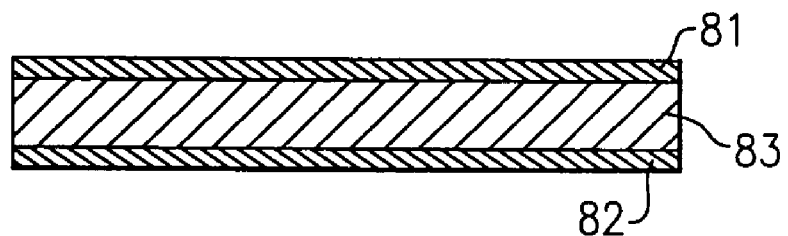
FIG. 10 is a sectional view along line 10—10 of the chip depicted in FIG. 8.

FIG. 7 schematically depicts a combination microbalance and optical monitor sensor in accordance with the third aspect of the present invention, including a chip 40 corresponding to the embodiment shown in FIGS. 4–6 as described above. In the embodiment shown in FIG. 7, the chip 40 is mounted on a body 44 made of a block with a center portion thereof milled out. The body 44 includes suitable conductors and insulators to conduct separately current from the first electrode 42 and current from the second electrode 43. A pair of biasing members 45 and 46 help to maintain the chip 40 in place. Voltage is applied between the first electrode and the second electrode by a power supply (not shown). The biasing members 45 and 46 minimize extraneous vibrations. FIG. 7 further depicts a light source 47 which directs a beam of light 48 through the chip 40 toward a detector 49. The positions of the light source 47 and the detector 49 can be switched, i.e., the light source 47 can instead be outside the body 44 and the detector 49 can be inside the body 44, if desired.

Figure 11:
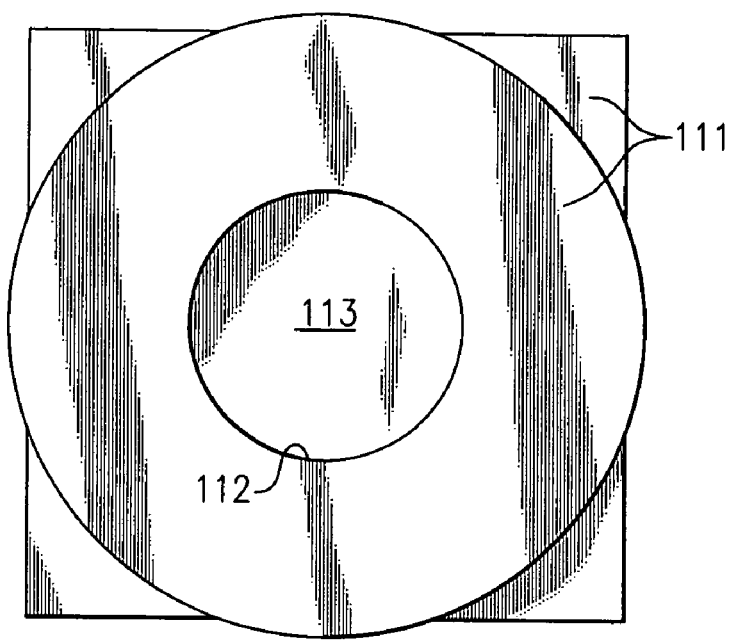
FIG. 11 is a schematic view of a combination microbalance and optical monitor sensor in accordance with a preferred aspect of the present invention.

FIG. 11 is a schematic view of a combination microbalance and optical monitor sensor in accordance with a preferred aspect of the present invention. The combination microbalance and optical monitor sensor depicted in FIG. 11 includes a holder 111 has an opening 112 in which a chip 113 is positioned. The chip 113 may be any chip within the scope of the present description. The holder 111 includes at least two contacts which are positioned such that they are in electrical contact with first and second electrodes of the chip 113, whereby current can be provided to the piezoelectric element in the chip 113 in order to cause the piezoelectric element to vibrate.

Figure 12:
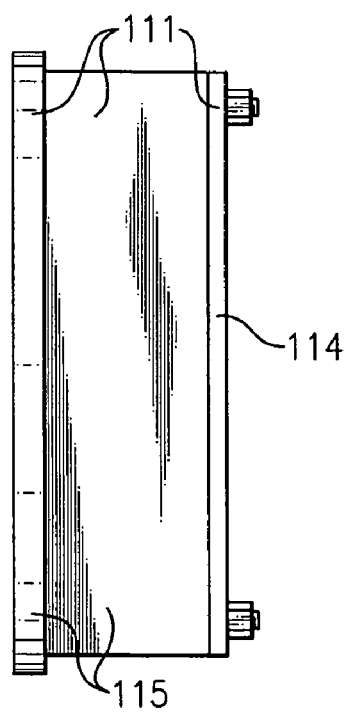
FIG. 12 is a side view of the combination microbalance and optical monitor sensor depicted in FIG. 11.

FIG. 12 is a side view of the combination microbalance and optical monitor sensor depicted in FIG. 11. FIG. 12 shows that the combination microbalance and optical monitor sensor includes a back plate 114 which is attached to a front section 115 (e.g., with nuts and bolts, two nuts being shown in FIG. 12). Preferably, the combination microbalance and optical monitor sensor includes one or more biasing element which holds the chip 113 against a region surrounding the opening 112 on the inside of the holder 111. A chip 113 can be removed from the holder 111, inserted into the holder 111 or replaced by removing the back plate 114 (e.g., by unscrewing nuts from bolts which are attached to the front section 115) and then removing the biasing element (s) (if present), and then removing, inserting or replacing the chip 113.

Any two or more structural parts of the chips and sensors described above can be integrated. Any structural part of the chips and sensors described above can be provided in two or more parts (which are held together, if necessary). Similarly, any two or more functions can be conducted simultaneously, and/or any function can be conducted in a series of steps.

The invention claimed is:

1. A chip for use in a combination microbalance and optical monitor sensor, said chip comprising:
   a piezoelectric element having a first surface; and
   first and second electrodes formed on said first surface and being spaced from each other,
   whereby current can be applied through said electrodes to cause at least a region of said piezoelectric element to undergo vibration, at least a portion of said piezoelectric element being translucent such that at least a portion of a beam of light directed toward said chip can be passed from outside of said chip, passed through a portion of said region of said piezoelectric element which is undergoing said vibration, and passed out of said chip.

2. A chip as recited in claim 1, wherein said piezoelectric element has a second surface such that at least a portion of a beam of light directed toward said first surface can be passed from outside of said chip, passed through said first surface, through a portion of said region of said piezoelectric element which is undergoing said vibration, and passed through said second surface.

3. A chip as recited in claim 1, wherein said piezoelectric element has a second surface such that at least a portion of a beam of light directed toward said second surface can be passed from outside of said chip, passed through said second surface, passed through a portion of said region of said piezoelectric element which is undergoing said vibration, and passed through said first surface.

4. A chip as recited in claim 1, wherein said piezoelectric element reflects at least a portion of light, whereby at least a portion of a beam of light directed toward said first surface can be passed from outside of said chip, passed through said first surface, passed into a portion of said region of said piezoelectric element which is undergoing said vibration, and passed back through said first surface.

5. A chip as recited in claim 1, wherein said piezoelectric element reflects at least a portion of light, whereby at least a portion of a beam of light directed toward said second surface can be passed from outside of said chip, passed through said second surface, passed into a portion of said region of said piezoelectric element which is undergoing said vibration, and passed back through said second surface.

6. A chip as recited in claim 1, said chip further comprising a reflective element on said first surface, whereby at least a portion of a beam of light directed toward a second surface of said piezoelectric element can be passed from outside of said chip, passed through said second surface, passed through a portion of said region of said piezoelectric element which is undergoing said vibration to said first surface, reflected by said reflective element, passed back through a portion of said region of said piezoelectric element which is undergoing said vibration, and passed back through said second surface and out of said chip.

7. A chip as recited in claim 1, wherein said piezoelectric element has a second surface and said chip further comprises a reflective element on said second surface, whereby at least a portion of a beam of light directed toward said first surface can be passed from outside of said chip, passed through said first surface, passed through a portion of said region of said piezoelectric element which is undergoing said vibration to said second surface, reflected by said reflective element, passed back through a portion of said region of said piezoelectric element which is undergoing said vibration, and passed through said first surface back out of said chip.

8. A chip as recited in claim 1, wherein said piezoelectric element has a second surface opposite to said first surface, said first surface being substantially convex.

9. A chip as recited in claim 8, wherein said second surface is substantially flat.

10. A chip as recited in claim 8, wherein said second surface is substantially convex.

11. A chip as recited in claim 1, wherein said piezoelectric element comprises quartz or gallium phosphate.

12. A chip for use in a combination microbalance and optical monitor sensor, said chip comprising:
a piezoelectric element; and
first and second electrodes in contact with said piezoelectric element and being spaced from each other, whereby current can be applied through said electrodes to cause at least a region of said piezoelectric element to undergo vibration,
at least a portion of at least said first electrode being translucent, and at least a portion of said piezoelectric element being translucent such that at least a portion of a beam of light directed toward said chip can be passed from outside of said chip, passed through said first electrode, passed through a portion of said region of said piezoelectric element which is undergoing said vibration, and passed out of said chip.

13. A chip as recited in claim 12, wherein said piezoelectric element reflects a portion of light, whereby a portion of a beam of light directed toward a first surface of said piezoelectric element can be passed from outside of said chip, passed through said first electrode, passed through first surface of said piezoelectric element, passed through a portion of said region of said piezoelectric element which is undergoing said vibration, and passed back through said first surface of said piezoelectric element.

14. A chip as recited in claim 12, wherein said piezoelectric element has a first surface and a second surface, at least a portion of said first electrode being positioned on said first surface, at least a portion of said second electrode being positioned on said second surface.

15. A chip as recited in claim 12, wherein said piezoelectric element has a first surface and a second surface, said chip further comprising a reflective element on said second surface, whereby at least a portion of a beam of light directed toward said first surface can be passed from outside of said chip, passed through said first electrode, passed through said first surface, passed through a portion of said region of said piezoelectric element which is undergoing said vibration to said second surface, reflected by said reflective element, passed back through a portion of said region of said piezoelectric element which is undergoing said vibration, and passed back through said first surface.

16. A chip as recited in claim 15, wherein said reflective element is said second electrode.

17. A chip as recited in claim 15, wherein said first surface is substantially convex.

18. A chip as recited in claim 17, wherein said second surface is substantially flat.

19. A chip as recited in claim 17, wherein said second surface is substantially convex.

20. A chip as recited in claim 15, wherein said piezoelectric element has a first surface and a second surface, an entirety of said first electrode being positioned on said first surface, and an entirety of said second electrode being positioned on said second surface.

21. A chip as recited in claim 12, wherein an entirety of said first electrode is translucent.

22. A chip as recited in claim 12, wherein at least a portion of said second electrode is translucent, such that at least a portion of a beam of light directed toward said chip can be passed from outside of said chip, passed through said first electrode, passed through a portion of said region of said piezoelectric element which is undergoing said vibration, passed through said second electrode and passed out of said chip.

23. A chip as recited in claim 22, wherein an entirety of said first electrode is translucent and an entirety of said second electrode is translucent.

24. A chip as recited in claim 12, wherein said piezoelectric element comprises quartz or gallium phosphate.

25. A chip as recited in claim 12, wherein said translucent portion of said first electrode comprises at least one material selected from the group consisting of indium tin oxide and tungsten trioxide.

26. A combination microbalance and optical monitor sensor, comprising:
- a chip as recited in claim 1;
- at least one light source which directs a beam of light toward said chip;
- at least one light intensity detector having a detection area which outputs a signal which has a magnitude which is proportional to an intensity of light exiting from said chip and incident upon said detection area;
- a power supply for applying a voltage between said first electrode of said chip and said second electrode of said chip; and
- a resonant frequency detector for detecting a resonant frequency of vibration of said chip.

27. A combination microbalance and optical monitor sensor, comprising:
- a chip as recited in claim 12;
- at least one light source which directs a beam of light toward said chip;
- at least one light intensity detector having a detection area which outputs a signal which has a magnitude which is proportional to an intensity of light exiting from said chip and incident upon said detection area;
- a power supply for applying a voltage between said first electrode of said chip and said second electrode of said chip; and
- a resonant frequency detector for detecting a resonant frequency of vibration of said chip.

28. A method of simultaneously piezoelectric crystal vibration monitoring and optically monitoring a layer, comprising:
- applying a voltage across a piezoelectric element from a first electrode to a second electrode, said first electrode and said second electrode being in contact with said piezoelectric element, said first electrode being spaced from said second electrode, thereby causing at least a region of said piezoelectric element to undergo vibration, said piezoelectric element being in contact with a layer which is being piezoelectric crystal vibration monitored and optically monitored, said piezoelectric element, said first and second electrodes and said layer together constituting an assembly;
- detecting a resonant frequency of said region of said piezoelectric element which is undergoing vibration;
- directing light toward said assembly such that at least a portion of said light enters said region of said piezoelectric element which is undergoing vibration; and
- detecting an intensity of at least one beam of light which is exiting from said assembly.

29. A method as recited in claim 28, wherein at least a portion of said light passes through said layer, through a portion of said region of said piezoelectric element which is undergoing said vibration, and out of said assembly.

30. A method as recited in claim 29, wherein at least a portion of said first electrode is translucent, and wherein said portion of light also passes through said translucent portion of said first electrode.

31. A method as recited in claim 29, wherein at least a portion of said second electrode is translucent, and wherein said portion of light also passes through said translucent portion of said second electrode.

32. A method as recited in claim 28, wherein said piezoelectric element has a first surface and a second surface, at least a portion of said light passing through said layer, through said first surface, through a portion of said region of said piezoelectric element which is undergoing said vibration, and through said second surface.

33. A method as recited in claim 32, wherein at least a portion of said first electrode is translucent, and wherein said portion of light also passes through said translucent portion of said first electrode.

34. A method as recited in claim 33, wherein at least a portion of said second electrode is translucent, and wherein said portion of light also passes through said translucent portion of said second electrode.

35. A method as recited in claim 28, wherein at least a portion of said light passes from outside of said assembly through said layer, passes through a first surface of said piezoelectric element into a portion of said region of said piezoelectric element which is undergoing said vibration, is reflected within said piezoelectric element, passes back through said first surface and passes back through said layer.

36. A method as recited in claim 35, wherein at least a portion of said first electrode is translucent, and wherein said portion of light also passes through said translucent portion of said first electrode.

37. A method as recited in claim 28, said assembly further comprising a reflective element on a first surface of said piezoelectric element, and wherein at least a portion of said light passes from outside of said assembly through a second surface of said piezoelectric element, passes through a portion of said region of said piezoelectric element which is undergoing said vibration to said first surface, is reflected by said reflective element, passes back through a portion of said region of said piezoelectric element which is undergoing said vibration, and passes back through said second surface and out of said chip.

38. A chip for use in a combination microbalance and optical monitor sensor, said chip comprising:
- a piezoelectric element having a first surface; and
- first and second electrodes formed on said piezoelectric element and being spaced from each other,
- whereby current can be applied through said electrodes to cause at least a region of said piezoelectric element to undergo vibration, at least a portion of at least one of said electrodes being reflective such that at least a portion of a beam of light directed toward said first surface of said piezoelectric element can be passed through a film being deposited on said chip, reflected by said reflective portion of said at least one of said electrodes, and passed back through said film being deposited.

39. A combination microbalance and optical monitor sensor, comprising:
- a chip as recited in claim 38;
- at least one light source which directs a beam of light toward said chip;
- at least one light intensity detector having a detection area which outputs a signal which has a magnitude which is proportional to an intensity of light exiting from said chip and incident upon said detection area;
- a power supply for applying a voltage between said first electrode of said chip and said second electrode of said chip; and
- a resonant frequency detector for detecting a resonant frequency of vibration of said chip.

40. A chip as recited in claim 1, wherein a second surface of said piezoelectric element is reflective, whereby at least a portion of a beam of light directed toward said second surface of said piezoelectric element can be passed from outside of the piezoelectric element and reflected by said second surface of said piezoelectric element.

41. A chip as recited in claim 1, wherein said first surface of said piezoelectric element is reflective, whereby at least a portion of a beam of light directed toward said first surface of said piezoelectric element can be passed from outside of the piezoelectric element and reflected by said first surface of said piezoelectric element.

42. A chip as recited in claim 12, wherein a surface of said piezoelectric element is reflective, whereby at least a portion of a beam of light directed toward said surface of said piezoelectric element can be passed from outside of the chip, passed through said first electrode, and reflected by said surface of said piezoelectric element.

43. A chip for use in a combination microbalance and optical monitor sensor, said chip comprising:
 a piezoelectric element having a first surface; and
 first and second electrodes spaced from each other,
 whereby current can be applied through said electrodes to cause at least a region of said piezoelectric element to undergo vibration, at least a portion of at least one of said electrodes being reflective such that at least a portion of a beam of light directed toward a first surface of said chip can be passed through a film being deposited on said chip, reflected by said reflective portion of said at least one of said electrodes, and passed back through said film being deposited.

\* \* \* \* \*